(12) United States Patent
Hatano et al.

(10) Patent No.: US 6,188,092 B1
(45) Date of Patent: Feb. 13, 2001

(54) SOLID IMAGING DEVICE HAVING AN ANTIFUSE ELEMENT AND METHOD OF MAKING THE SAME

(75) Inventors: Keisuke Hatano; Yasutaka Nakashiba, both of Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/478,688

(22) Filed: Jan. 6, 2000

(30) Foreign Application Priority Data

Jan. 6, 1999 (JP) .................................................. 11-001446

(51) Int. Cl.[7] ........................ H01L 27/148; H01L 29/768
(52) U.S. Cl. .......................... 257/229; 257/232; 257/233; 257/530; 257/538
(58) Field of Search ................................... 257/229, 230, 257/232, 233, 530, 538, 435

(56) References Cited

U.S. PATENT DOCUMENTS

| | | | |
|---|---|---|---|
| 5,831,325 | * 11/1998 | Zhang | .................................. 257/530 |
| 5,936,288 | * 8/1999 | Tsuchida et al. | ..................... 257/370 |
| 5,978,248 | * 11/1999 | Marr et al. | .............................. 365/96 |
| 5,990,953 | * 11/1999 | Nakashiba | ............................. 348/314 |

* cited by examiner

Primary Examiner—Ngân V. Ngô

(57) ABSTRACT

A solid imaging device including a substrate voltage generating device possessing high display quality, high reliability, and method of manufacturing. The solid imaging device includes a plurality of photoelectric conversion elements, a vertical charge transfer portion for transferring the signal charges generated by the photoelectric conversion element, and a substrate voltage generating circuit. The substrate generating circuit 10 includes a variable resistor 11 formed by arranging a plurality of sets formed by selection switches 13 and resistors 14a–14e, and a load resistor 12 disposed by connecting with the variable resistor 11 between the source potential $V_{dd}$ and the earth potential, and the substrate voltage $V_{sub}$ is obtained from a contact between the variable resistor 11 and the load resistor 12. The selection switches 13 are consituted by antifuse elements.

12 Claims, 8 Drawing Sheets

SOLID IMAGING DEVICE HAVING AN ANTIFUSE ELEMENT AND METHOD OF MAKING THE SAME

BACKGROUND OF THE INVENTION

1. Field of the Invention

The present invention relates to solid imaging devices and methods of manufacturing the same, and particularly relates to structures and methods of forming substrate voltage generating circuits used for controlling blooming voltages of solid imaging devices.

2. Background Art

Figure 9:
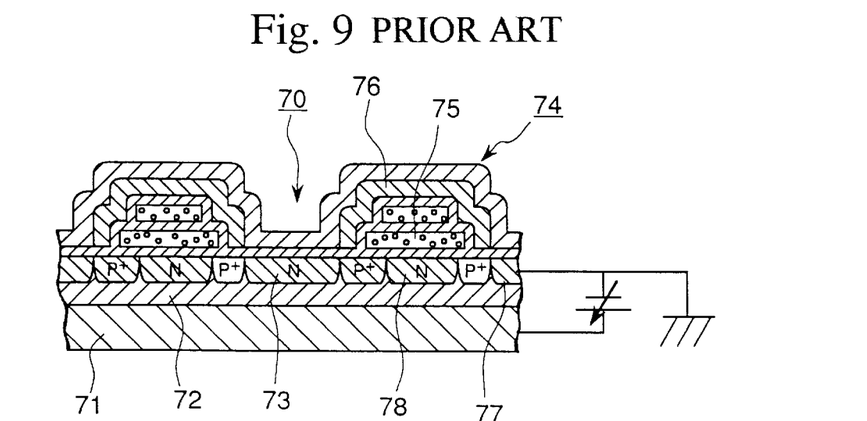
FIG. 9 is a cross-sectional diagram showing a n example of a structure of the photoelectric conversion portion of conventional CCD-type solid imaging device.

FIG. 9 illustrates an example of conventional CCD-type solid imaging devices. In this example, as shown in FIG. 9, the photoelectric conversion portion 70 comprises a P-type well 72 in an N-type substrate 71, and an N-type region 73 is formed on the P-type well 72. The charge transfer portion 74 comprises a charge transfer electrode 75 covered by a light shielding film. Electrons are transferred to the N-type region 78 of the charge transfer portion 74 after being stored in the N-type region 73. If the amount of the charge stored in the N-type region 73 of the photo conversion region 70 exceeds a transferable charge quantity, the charge overflows from the region during the transfer operation. Thus, the CCD-type solid imaging device is designed such that the charge exceeding the necessary amount is swept to the substrate so as not to exceed the transferable amount.

Figures 10A, 10B:
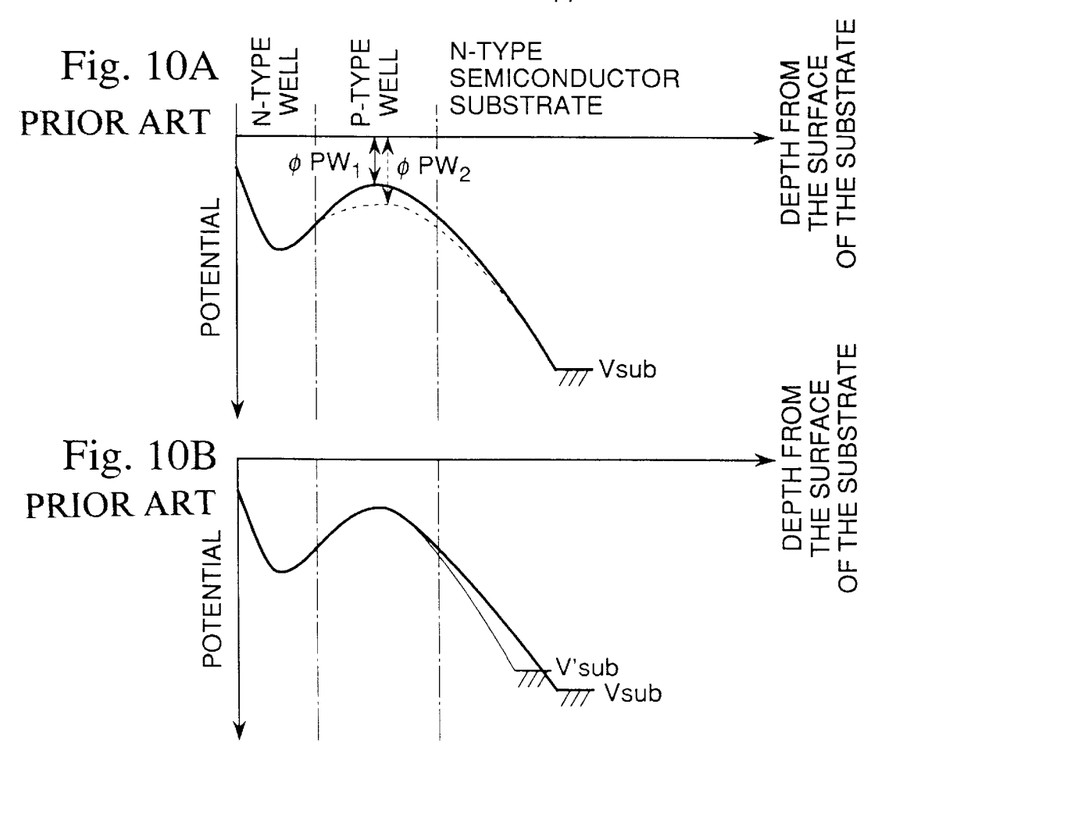
FIGS. 10A and 10B are diagrams showing potential distributions in a substrate of a conventional solid imaging device.

As shown in charge distribution diagrams of FIGS. 10A and 10B, the amount of charge stored in the photoelectric conversion region is determined by the potential barrier ΦPW of the P-type well region which constitutes the vertical overflow drain structure (VOD). That is, when the generated charge exceeds the amount of the charge which can be stored in the N-type region, the charge exceeding the storable amount is swept to the N-type semiconductor substrate by going beyond the potential barrier ΦPW of the VOD. The amount of the charge which can be stored in the photoelectric conversion region, in other words, the height of the potential barrier ΦPW, can be controlled by the substrate voltage $V_{sub}$, which is the voltage applied to the substrate which constitutes the drain (this substrate voltage is called the blooming control voltage).

The potential distribution curve fluctuates as shown by the solid line or the broken line of FIG. 10A, caused by fluctuations of the impurity in the concentration or the depth at a wafer surface due to fluctuations of the impurity profile at the time of ion implantation in the manufacturing process, and the height of the potential barrier ΦPW also fluctuates for each device having different values such as $ΦPW_1$ or $ΦPW_2$. As a result, since the device characteristic fluctuates due to the fluctuation of the amount of the charge which can be stored in the photoelectric conversion region, the amount of charge of the conventional device has been controlled so as to be constant by changing the blooming control voltages $V_{sub}$ and $V_{sub}$ by setting for every device different substrate voltages applied from the circuit side of the camera system.

However, when in use, in the case of applying a different voltage for each device from the circuit side of the camera system, the circuit structure for generating different substrate voltages at the camera side becomes complicated, and the manufacturing line also becomes complicated because it becomes necessary to prepare different components for each device. Accordingly, customers come to require providing in the solid imaging device a substrate voltage control circuit which controls the substrate voltage so as to conform to the individual imaging device. A substrate voltage control circuit is in practical use, which, for example, produces a desired voltage by a resistance dividing method for obtaining an optional contact among a plurality of resistors which are connected between the source potential and the earth potential. An example of the substrate voltage control circuit is proposed, which is constructed by use of a MOSFET, fuses, and source followers (Hirouki Yamauchi et al., "A Ultra Small Sized 1 mm 50,000 Pixels IT-Image Sensor", Image Information Media Academy, Mar. 27, 1998). Another example using a non-volatile memory transistor is reported, and a patent application filed by the present inventor (Japanese Patent Applications, First Publications No. Hei 10-84112, and No. Hei 10-15737).

In the CCD-type solid imaging device, malfunction is sometimes caused by contamination with dust. In general semiconductor devices such as memory devices, the wiring layer is covered by the passivation layer so that inconvenience will not be resulted even if the passivation layer is contaminated by dust. However, in the CCD-type solid imaging device, if the photoelectric conversion region is contaminated by dust, the dust particle blocks the light incident to the photoelectric conversion region and the pixel covered by the dust particle will form a black defect. A problem arises that the black defect or so called black flaw degrades the quality of the display. In other words, more attention should be taken to prevent the CCD-type solid imaging devices from being contaminated by dust than the other semiconductor devices such as memory devices.

However, when a substrate voltage generating device uses fuses, it is necessary to cut the fuse for controlling the substrate voltage. For cutting the fuse, application of a high voltage or irradiation by laser light are carried out, which causes dust by scattering metal particles constituting the fuse. Therefore, it is not desirable to install a highly volatile fuse in the CCD-type solid imaging device, in order to prevent from generating black flaws.

When the substrate voltage control circuit uses a non-volatile memory transistor, a problem arises that a threshold voltage of the transistor changes when light (especially, ultraviolet light) is incident to the transistor, and reliability of the substrate voltage generating circuit is degraded because its characteristic fluctuation becomes great.

In such a circumstance, it has been desired to provide a CCD-type solid imaging device which does not generate an inconvenience in the display quality and which is provided with a highly reliable substrate voltage control circuit. It has been desired also from the points of view of high integration of the solid imaging device and of low cost production to provide a substrate voltage control circuit having the smallest occupied area and capable of being produced by comparatively simple manufacturing process.

SUMMARY OF THE INVENTION

It is therefore the object of the present invention to provide solid imaging devices comprising a reasonable substrate voltage generating circuit provided with various advantages.

According to the first aspect, the present invention provides a solid imaging device comprising: a plurality of photoelectric conversion elements; a charge transfer portion comprising a charge transfer electrode, which read and transfer charge signals generated at said plurality of photoelectric conversion elements; and a substrate voltage generating circuit, which comprises a plurality of resistors connected in between a first potential and a second potential, and a plurality of selection switches for selecting said plurality of resistors for obtaining a desired substrate voltage by combining conduction and non-conduction states of said selection switches; wherein, said selection switches are constituted by anti-fuse elements.

As described above, the conventional variable resistor, mentioned in the "background art" section, comprises a plurality of fuse elements for switching, and some of the fuse elements are cut off by voltage application or laser light irradiation when converting them to the non-conductive state. The "anti-fuse element" used in this application is an element in which two wiring layers are separated by an insulating film, and when it is necessary to connect two wiring layers into the conductive state, the insulating film is broken down by applying high voltage.

In the solid imaging device of the present invention, the substrate voltage generating circuit is constructed by a so-called resistance division circuit, comprising a plurality of resistors connected in between the first and second potentials. The selection switches for selecting the resistors are constituted by the above described anti-fuses, and two wiring can be converted into the conductive state by breakdown of the intervening insulating film. Accordingly, there is no danger of dust generated when the fuse element is used. The characteristics of the substrate voltage generating device of the present invention do not so much fluctuate by light when compared to the conventional device using a non-volatile memory, so that the present device has high reliability. That is, the present substrate voltage generating device of the present invention avoids the dust problem and thus black defects due to dust adhesion, so that the present invention provides the solid imaging device possessing superior image quality and high reliability.

In the solid imaging device of the present invention, one form of substrate voltage generating circuit can be adopted in which all of a plurality of resistors are connected in series. In such a case, the selection switches may be connected respectively to each of the plurality of resistors in parallel, or may be connected to respective contacts of the plurality of resistors. Another form of the substrate voltage generating circuit can be adopted, which comprises a variable resistor constituted by arranging in parallel a plurality of sets composed by connecting selection switches and resistors in series; and a load resistor connected with said variable resistor in series between the first potential and the second potential. In this substrate voltage generating circuit, it is preferable that respective resistances of a plurality of resistors forming said variable resistor be set at $2^n$ (n=0, 1, 2, . . . ) times the minimum resistance.

In the solid imaging device of the present invention, a desired substrate voltage can be obtained by the substrate voltage generating circuit formed by the resistance division circuit. However, in the former substrate voltage generating circuit formed by connecting a plurality of resistors in series, great many resistors must be used in order to control the substrate voltage in a fine serration. In contrast, in the latter resistance division circuit, a substrate voltage generating circuit is composed by connecting a variable resistor and a load resistor in series between the first potential and the second potential, and the variable resistor is composed by arranging a plurality of sets in parallel, which are formed by connecting a resistor and a selection switch in series. As described above, it is preferable that respective resistances of a plurality of resistors forming said variable resistor is set at $2^n$ (n=0, 1, 2, . . . ) times the minimum resistance. When the minimum resistance is R, resistances of the other resistors are set as 2R, 4R, 8R and 16R, it becomes possible to divide the resistance in a finer serration by a limited number of resistors. In addition, its is possible to reduce the size of the area for forming the substrate voltage generating circuit by the use of this type of substrate voltage generating circuit.

The practical anti-fuse element can be composed by forming the lower conductive film, the upper conductive film, and the insulating film inserted between the lower and upper conductive films. Those two conductive films can be formed using two layers selected from the group consisting of a layer forming the charge transfer electrode, a layer forming a light shielding layer covering the charge transfer electrode, and a layer forming the peripheral circuit wiring.

In general, the solid imaging device comprises constituting elements such as a light shielding film for preventing degradation of image signals by light irradiation into the charge transfer portion by covering the charge transfer electrode, and a peripheral circuit wiring for supplying charge transfer pulses to the charge transfer electrode. The charge transfer electrode and the peripheral circuit wiring are formed by conductive films and the light shielding film is also formed by a conductive material. Among these three layers, two conductive layers can be utilized for the lower and upper films of the anti-fuse elements. In this case, the insulating film inserted between the upper and the lower conductive films may be formed by the use of the interlayer insulating film between the charge transfer electrode and the light shielding film or the interlayer insulating film between the light shielding film and the peripheral circuit wiring, or may be formed by a different process.

It is possible to use the normal wiring resistor or the MOSFET for forming the substrate voltage generating circuit. The gate electrode of the MOSFET may be formed by the same material as that of the charge transfer electrode. The resistors can be easily formed by converting the MOSFETs into source follower-types by connecting the gate and the source to each other. When the MOSFET is used as the resistor, the resistance can be easily controlled by changing the gate length or the gate width.

The first method of manufacturing a solid imaging device of the present invention comprises the steps of: forming a charge transfer electrode on a substrate provided with a plurality of photoelectric conversion regions; forming a light shielding film for covering said charge transfer electrode through a first interlayer insulating film and forming the lower conductive film of the anti-fuse element made by the same layer as said light shielding film; and forming a peripheral circuit wiring and forming the upper conductive film made by the same layer as said peripheral circuit wiring on the lower conductive layer of the anti-fuse element through a second interlayer insulating film.

The second method of manufacturing a solid imaging device of the present invention comprises the steps of: forming a charge transfer electrode on a semiconductor substrate provided with a plurality of photoelectric conversion elements as well as forming the lower conductive film of the anti-fuse element made by the same layer as said charge transfer electrode; forming a light shielding film for covering said charge transfer electrode through a first interlayer insulating film as well as forming the lower conductive film of the anti-fuse element by the same layer as said light shielding film; and forming the peripheral circuit wiring on the second interlayer insulating film.

The third method of manufacturing a solid imaging device of the present invention comprises the steps of: forming a charge transfer electrode on a substrate provided with a plurality of photoelectric conversion regions as well as forming the lower conductive film of the anti-fuse element made by the same layer as said charge transfer electrode; forming a light shielding film covering said charge transfer electrode through a first interlayer insulating film as well as forming the lower conductive film of the anti-fuse element made by the same layer as said light shielding film; and forming peripheral circuit wiring and forming the upper conductive film made by the same layer as said peripheral circuit wiring on the lower conductive layer of the anti-fuse element through a second interlayer insulating film.

DETAILED DESCRIPTION OF THE INVENTION

[First Embodiment]

Hereinafter, the first embodiment of the present invention is described with reference to FIGS. 1 to 4.

Figure 1:
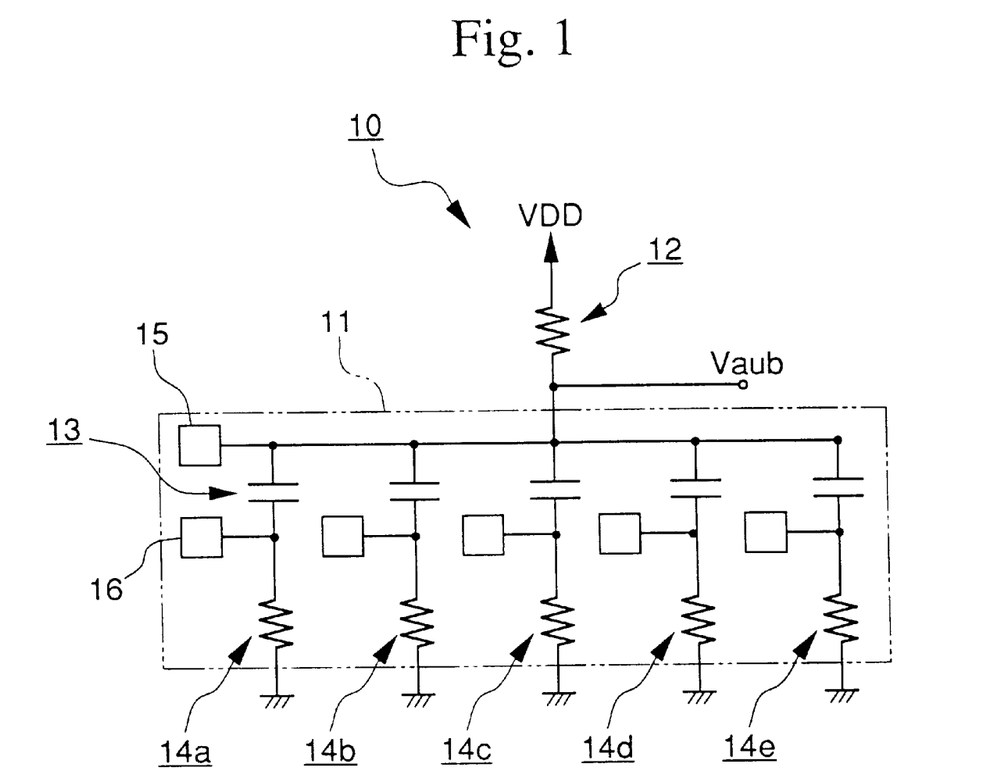
FIG. 1 is a circuit diagram showing a structure of a substrate voltage control circuit of a CCD-type solid imaging circuit according to the first embodiment of the present invention.
Figure 2A:
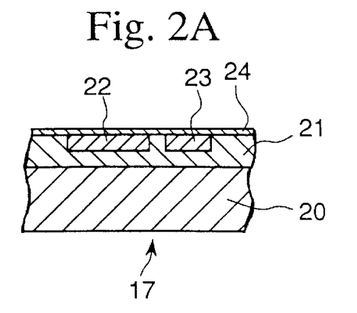
FIGS. 2A, 2B, and 2C are cross-sectional diagrams showing the manufacturing process of the CCD-type solid imaging circuit according to the first embodiment of the present invention.
Figure 2B:
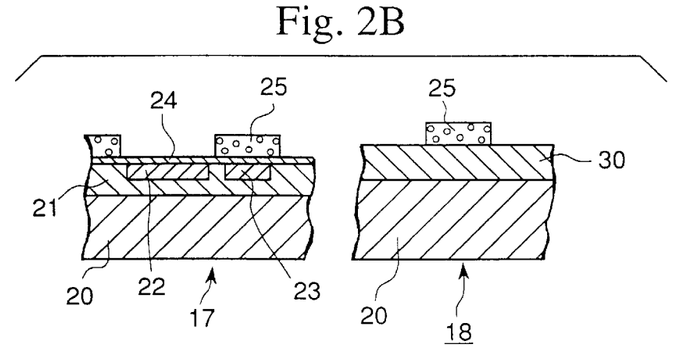
Figure 2C:
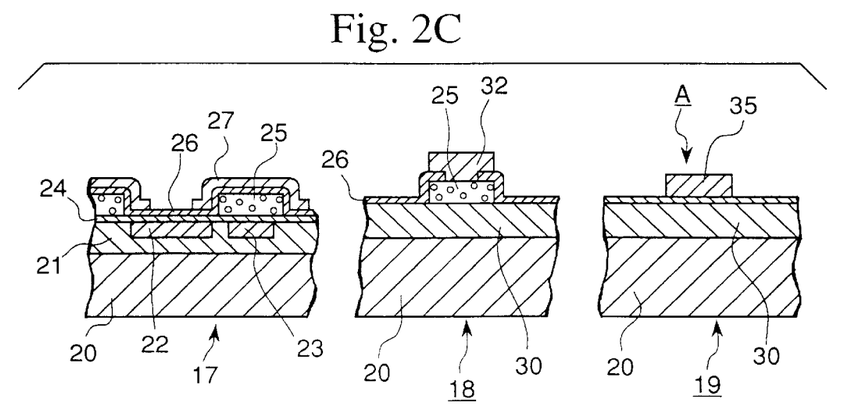
Figure 3A:
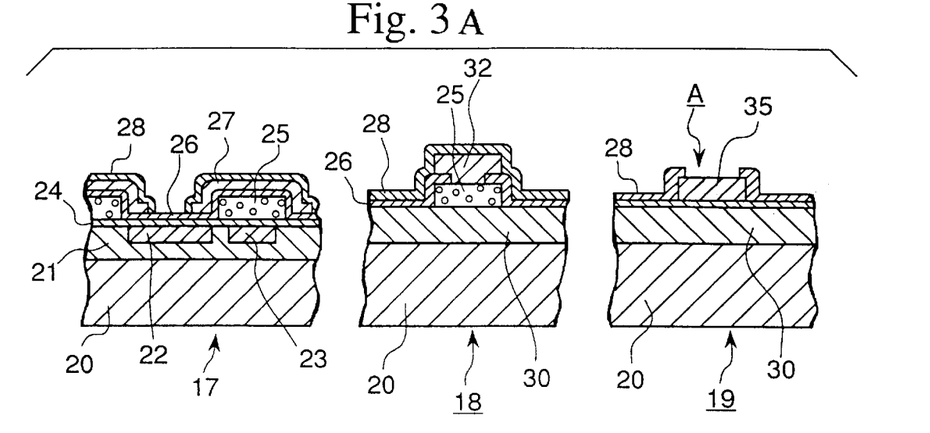
(FIGS. 3A, 3B, and 3C are cross-sectional diagrams showing the manufacturing process continued from FIGS. 2A, 2B, and 2C.
Figure 3B:
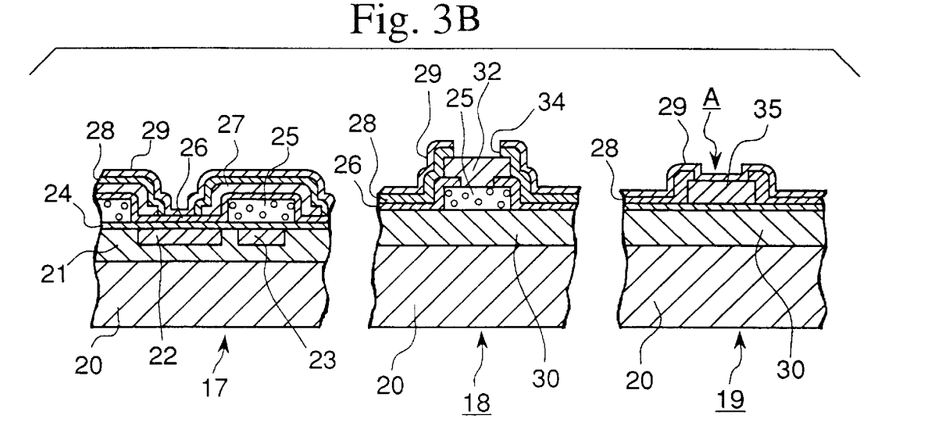
Figure 3C:
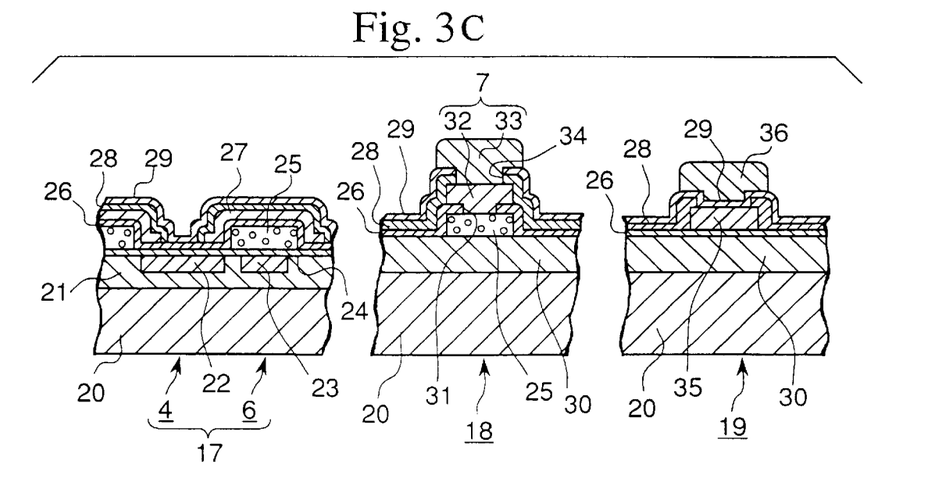
Figure 4:
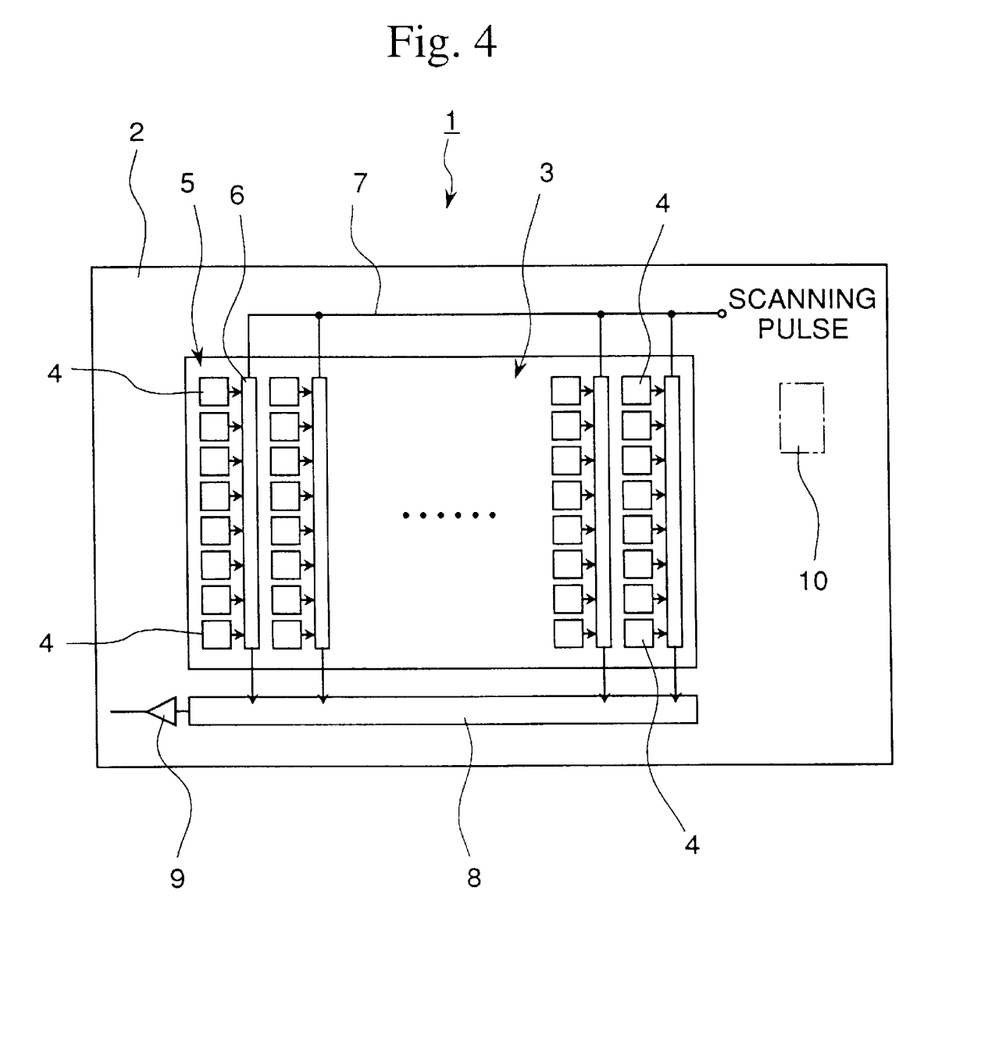
FIG. 4 is a schematic diagram showing the structure of the CCD-type solid imaging circuit according to the first embodiment of the present invention.

FIG. 1 is a circuit diagram showing a structure of a substrate voltage control circuit of a CCD-type solid imaging circuit according to the first embodiment of the present invention. FIGS. 2A, 2B, and 2C are cross-sectional diagrams showing the manufacturing process of the CCD-type solid imaging circuit according to the first embodiment of the present invention. FIGS. 3A, 3B, and 3C are cross-sectional diagrams showing the manufacturing process continued from FIGS. 2A, 2B, and 2C. FIG. 4 is a schematic diagram showing the structure of the CCD-type solid imaging circuit according to the first embodiment of the present invention.

As shown in FIG. 4, features of the CCD-type solid imaging device 1 according to the present embodiment are an imaging region 3 at the center of the chip, a plurality of photoelectric conversion elements are disposed in the imaging region 3, and a vertical charge transfer region 6 is disposed adjacent to a line of the photoelectric conversion region 5 arranged in the vertical direction shown in FIG. 4. Further, at the outside of the imaging region 3, there is disposed wiring 7 for supplying to each charge transfer electrode a scan pulse for reading and transferring the signal charge stored by a predetermined pulse interval in each photoelectric conversion region, a horizontal charge transfer region 8 for reading and transferring the signal charge from the vertical charge transfer region 6, and an output amplifier 9. The solid imaging device also comprises a substrate voltage generating circuit 10 for generating the substrate voltage which corresponds to the blooming voltage.

The substrate voltage generating circuit 10 is designed, as shown in FIG. 1, such that the substrate voltage $V_{sub}$ is obtained from a contact point of a variable resistor 11 and a load resistor 12, wherein the variable resistor 11 and the load resistance 12 are connected in series between the source voltage $V_{dd}$ (the first potential) and the earth potential (the second potential). Furthermore, the variable resistance 11 is composed of a plurality of sets (5 sets in the present embodiment) formed by connecting selection switches 13 made of anti-fuse elements 13 and resistors 14a to 14e in series.

Practically, a diffusion layer resistor or a polysilicon resistor can be used for the resistors 14a to 14e constituting the variable resistor 11 and the load resistor 12. The diffusion layer resistor can be formed simultaneously during formation of the N-well layer for forming the charge transfer portion by an ion implantation process. In contrast, in the case of the polysilicon resistor, the resistor can be formed simultaneously at the time of forming the polysilicon electrode for forming the transfer electrode. It is possible for each resistor to establish the resistance at an optional value. Respective one sides of two electrodes of the anti-fuse elements which constitutes the selection switch 13 are connected in common, and pads 15 and 16 are provided in order to apply a voltage on both sides of each anti-fuse element.

FIG. 3C illustrates cross-sectional structures, sequentially from left to right, of cell-regions 17, the peripheral circuit wiring portion 18, and the anti-fuse element forming portion 19. In the cell region 17, a P-type well region 21 is formed on the N-type silicon substrate 20 (semiconductor substrate), and on the P-type well region 21, the N-type region 22 of the photoelectric conversion element 4 and the N-type region 23 of the vertical charge transfer portion 6 are formed. The gate insulating layer 24 made of silicon oxide film is formed on the substrate 20, and a charge transfer electrode 25 made of polysilicon is formed on the gate insulating film 24 of the vertical charge transfer portion 6. Furthermore, the first interlayer insulating film 26 is formed over the entire surface such that the light shielding film 27 covers the charge transfer electrode 25 through the first interlayer film 26. In addition, the second interlayer insulating film 28 and the third interlayer insulating film 29 are formed so as to cover the light shielding film 27.

Next, the peripheral circuit wiring portion 18 is described. The particular portion 18 shown in FIGS. 2 and 3 illustrates a contact portion between the peripheral circuit wiring 7 and the charge transfer electrode 25. A field oxide film 30 is formed on a silicon substrate 20, and the charge transfer electrode 25 is formed on the filed oxide layer 30. The first interlayer insulating film 26 covering the charge transfer electrode 25 is opened above the charge transfer electrode 25 and a contact hole 31 is formed. The lower wiring layer 32 made of tungsten is connected to the charge transfer electrode 25 through the contact hole 31. The second and third interlayer insulating films 28 and 29 are opened above the lower wiring layer 32 and the upper wiring layer 33 made of aluminum is connected to the lower wiring layer 32 through the contact hole 34. Here, the tungsten layer forming the lower wiring layer is identical with the tungsten layer constituting the light shielding film 27. The peripheral circuit wiring 7 is formed as two layers by laminating aluminum on the tungsten, and the presence of the aluminum film provides the low resistance and high reliability.

The anti-fuse element portion 19 is made by forming a field oxide layer 30 and the first interlayer insulating film 26 on the N-type silicon substrate, and a lower conductive layer 35 made of tungsten is formed on the first interlayer insulating film 26. The tungsten film constituting the lower conductive layer 35 is identical with the tungsten film constituting the light shielding film 27 of the vertical charge transfer portion 6 and the lower wiring layer 32 of the peripheral circuit wiring 7. Furthermore, the periphery of the lower conductive film 35 is covered with the second interlayer insulating film 28 and the third interlayer insulating film 29. The second insulating film 28 located at the central part of the lower conductive film 35 is removed and the central part of the lower conductive film 35 is covered only by the thin third interlayer insulating film 29 at a thickness of 200 Å. An upper conductive layer 36 made of aluminum is formed on the lower conductive layer 35 through the third interlayer insulating film 29. The aluminum film constituting the upper conductive layer 36 is identical with the aluminum film constituting the upper wiring layer 33. Thus, when a high voltage is applied between the lower conductive layer 35 and the upper conductive layer 36, breakdown may occur in between the lower conductive layer 35 and the upper conductive layer 36 particularly at a portion where only the interlayer insulating film 29 exists.

Hereinafter, a method of manufacturing the solid imaging device is described with reference to FIGS. 2A–2C and 3A–3C.

First, as shown in FIGS. 2A, in the cell region, a P-type well region 21 is formed on the N-type silicon substrate 20, and an N-type region 22 for constituting the photoelectric conversion element 4 and an N-type region 23 for constituting the vertical charge transfer portion 6 are formed respectively on the P-type well region. A silicon oxide film is formed on the substrate 20 for forming the gate insulating film 24. In the peripheral circuit wiring portion 18 (the anti-fuse element forming portion 19), a thick field oxide layer 30 is formed on the surface of the N-type silicon substrate 20 (not shown in the figure).

Subsequently, as shown in FIG. 2B, after depositing a polyslicon film over the entire surface, and by patterning the polysilicon film, a charge transfer electrode 25 is formed on the gate insulating film 24 or the field oxide film 21 so as to extend from the vertical charge transfer portion 6 of the cell portion 17 to the peripheral circuit wiring portion 18.

Subsequently, as shown in FIG. 2C, the first interlayer insulating film 26 is formed over the entire surface, and by patterning this insulating film, a contact hole 31 is formed, in the peripheral circuit wiring portion 18, for connecting the charge transfer electrode 25 with the lower wiring layer of the peripheral circuit wiring 7, being formed later. Subsequently, in the cell region, by forming and patterning a tungsten film, a light shield film is formed, which covers the charge transfer electrode 25 through the first interlayer insulating film 26. At the same time, in the peripheral circuit wiring portion 18, a lower wiring layer 32 of the peripheral circuit wiring portion 7 is formed, which is connected with the charge transfer electrode 25 through the contact hole 31. In the anti-fuse element forming portion 19, the lower conductive film 35 of the anti-fuse element is formed.

Subsequently, as shown in FIG. 3A, in the anti-fuse element forming portion 19, after forming a plasma silicon nitride film as the second interlayer insulating film 28 over the entire surface, a part of the plasma silicon nitride film above the lower conductive film 35 is removed by patterning the plasma silicon nitride film.

Subsequently, as shown in FIG. 3B, a thin plasma silicon nitride film is formed as the third interlayer insulating film 29 over the entire surface, and, in the peripheral circuit wiring portion 18, the second insulating film and the third insulating film are opened at a portion above the lower wiring layer in order to form a contact hole for connecting the lower wiring layer with the upper wiring layer being formed later. At the same time, in the anti-fuse element forming portion 19, a portion, where the second interlayer insulating film has been removed, is covered only by the third insulating film 29.

Subsequently, as shown in FIG. 3C, in the peripheral circuit wiring portion 18, by depositing and patterning an aluminum film, the upper wiring layer 33 of the peripheral circuit wiring 7 connected with the lower wiring layer 32 through the contact hole is formed. At the same time, in the anti-fuse element forming portion 19, an upper conductive film 36 of the anti-fuse element is formed. Finally, a passivation film covering the peripheral circuit wiring is formed, and patterning for exposing the terminal of the pad portion is carried out, which follows a sintering treatment (hydrogen annealing treatment).

The manufacturing process of the solid imaging device according to the present embodiment is completed by the above process.

In the solid imaging device according to the present embodiment, the substrate voltage generation circuit 10 corresponds to the resistance dividing circuit comprising the variable resistor 11 and the load resistor 12, and the desired substrate voltage $V_{sub}$ is obtainable from the contact point of these resistors 11 and 12. The solid imaging device of the present embodiment is provided with a selecting switch 13 constituted by the anti-fuse element, so that the selecting switch is turned on by breakdown of the insulating film by applying the high voltage, and there is no concern about the contamination of the device by dust during breakdown. In addition, the fluctuation of the characteristic of the device by light is smaller than the case of using a non-volatile memory in the substrate voltage generating circuit. Consequently, it is possible to prevent generation of the black defect by dust particles on pixels, and it is also possible to obtain a solid imaging device providing a superior display quality and high reliability.

Since the variable resistor is arranged into a so-called piano switch form, that is, arranging in parallel a plurality of sets formed by connecting the selection switch and the resistor in series, the substrate voltage generation circuit 10 requires only a small area.

In the present embodiment, the lower conductive film 35 is formed by a tungsten film which is identical with that of the light shielding layer 27, and the upper conductive layer 36 is formed by an aluminum layer which is identical with that of the upper wiring layer 33 of the peripheral wiring portion 7.

In addition, the lower conductive film 35 and the upper conductive film 36 are formed by patterning simultaneously during formation of the light shielding film 27 or the peripheral circuit wiring portion 7. Although it is necessary to add a step of forming a thin insulating film for the anti-fuse element portion, it is not necessary to add the individual formation steps of the anti-fuse element to the manufacturing process of the imaging device. Thus, the manufacturing process remains uncomplicated. Moreover, since the number of photo masks used in the manufacturing process of the solid imaging device does not increases due to the formation of the non-fuse element, the manufacturing cost does not increase.

In the present embodiment, the method is adopted when forming the thin insulating layer of the anti-fuse element to form the thin third interlayer insulating film 29 over the entire surface after removing a portion for forming the thin film 29 in the second interlayer insulating film 28 formed on the lower conductive layer 35. It is necessary to control the thickness of the insulating film of the anti-fuse element from the point of view of facilitating the breakdown of the insulating film within a certain voltage range. In the present embodiment, the thickness of the insulating film of the anti-fuse element can be determined by the thickness during formation of the third interlayer insulating film, so that it is possible to control the thickness precisely and to stabilize the voltage applied to the selecting switch 13.

The present invention is not limited to the embodiment described above, and variants thereof can be envisaged without passing beyond the scope of the invention. For example, a tungsten film is used for the lower conductive film of the anti-fuse element as well as for the light shielding film, and an aluminum film is formed for the upper conductive film as well as for the upper wiring layer of the peripheral circuit wiring portion, but the materials that can be used for the lower conductive layer and the upper conductive layer are not limited to these examples. A combination may be adopted wherein the upper conductive film is formed by the same material as that of upper wiring layer of the peripheral circuit wiring portion, and another combination may be adopted wherein the lower conductive film is formed by the same material as that of the charge transfer electrode and the upper conductive film is formed by the same material as that of the light shielding film.

Although practical examples of materials for respective films include, in the case of the above embodiment, polysilicon for the charge transfer electrode, tungsten for the light shielding film, and aluminum for the upper wiring layer of the peripheral circuit wiring portion, various materials may be used not limited to those materials. For example, polycides or metals may be used for the charge transfer electrode, and various materials may be used as the material for the light shielding film. Among these various materials, it is preferable to use materials having low reflectance ratios when considering the light obliquely incident to the charge transfer electrode and being reflected in the insulating films. In addition, in order to shield the above obliquely incident light, it is preferable for the light shielding layer to cover the side wall portion of the charge transfer electrode as much as possible. In this case, the light shielding layer is formed to cover the step portion, so that it is preferable to use metals having a good step-coverage property such as tungsten, titanium, or cobalt. Various metals may be used for forming the peripheral circuit wiring.

As shown above, various material combinations may be applied to the lower conductive layer and the upper conductive layer of the anti-fuse element, so that it is possible to select various interlayer insulating films in accordance with the material combination of the conductive layers.

However, in the manufacturing process of the CCD-type solid imaging device, the sintering treatment process is provided as the final process in order to prevent current leakage from occurring under the charge transfer electrode. The sintering treatment is a process for executing hydrogen termination of dangling bonds, which causes current leakage, and which are present at the interface between the gate insulating film (silicon oxide film) and the silicon substrate or present at the interface of the filed oxide film and the silicon substrate. In the CCD-type solid imaging device, the occurrence of a leakage current causes a so-called white defect, in which a pixel which must be black changes into white. Thus, the interlayer insulating films of the CCD-type solid imaging device are required to provide properties such as being permeable to hydrogen or containing hydrogen therein for the sintering treatment. Examples of materials which are permeable to hydrogen include silicon oxide and amorphous silicon films, and examples of materials containing hydrogen include plasma silicon nitride or plasma silicon oxynitride films.

As described in the present embodiment, it is a reasonable combination of manufacturing processes to produce the lower conductive film, the upper conductive film of the anti-fuse element, and the insulating film by films for forming the cell portion during the same process. However, the present invention is not limited to the above combination, and although the manufacturing process becomes complicated, the anti-fuse element may be formed by films different from those of the cell portion, or those films may be formed by different processes.

As described above, the thin insulating film of the anti-fuse element is formed by the steps of once removing the insulating film at the portion for forming the thin film, and then forming the thin film over the entire surface. Other methods include etching the thick insulating film into the thin film, or leaving the thin film after inserting the interlayer insulating film for use as an etching stopper film.

[Second Embodiment]

Hereinafter, the second embodiment of the present invention will be described with reference to FIGS. 5 and 6.

In the first embodiment, the diffusion layer resistor or the polysilicon resistors are used for the resistors to form the substrate voltage generating circuit. However, an example is described, in which a source follower-type MOSFET is used in place of the above mentioned resistors. Since the structure of the solid imaging device of this embodiment as a whole is the same as that of the first embodiment, explanations are omitted.

Figure 6:
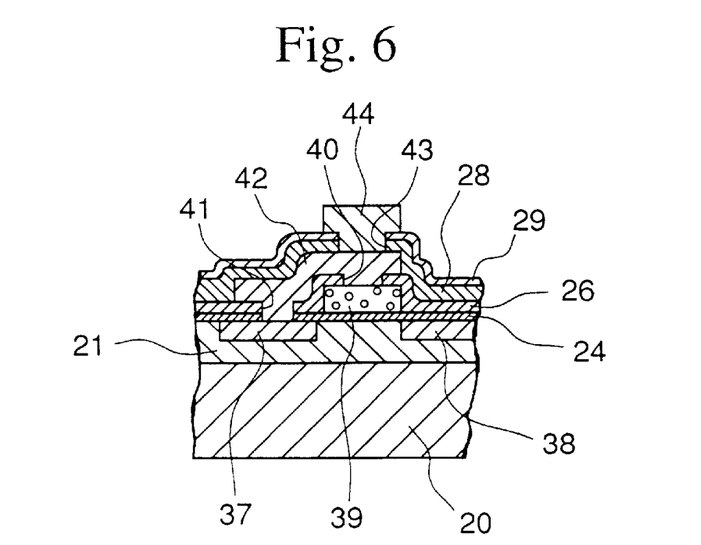
FIG. 6 is a cross-sectional diagram showing resistors as a component constituting the above substrate voltage control circuit shown in FIG. 5.
Figure 7:
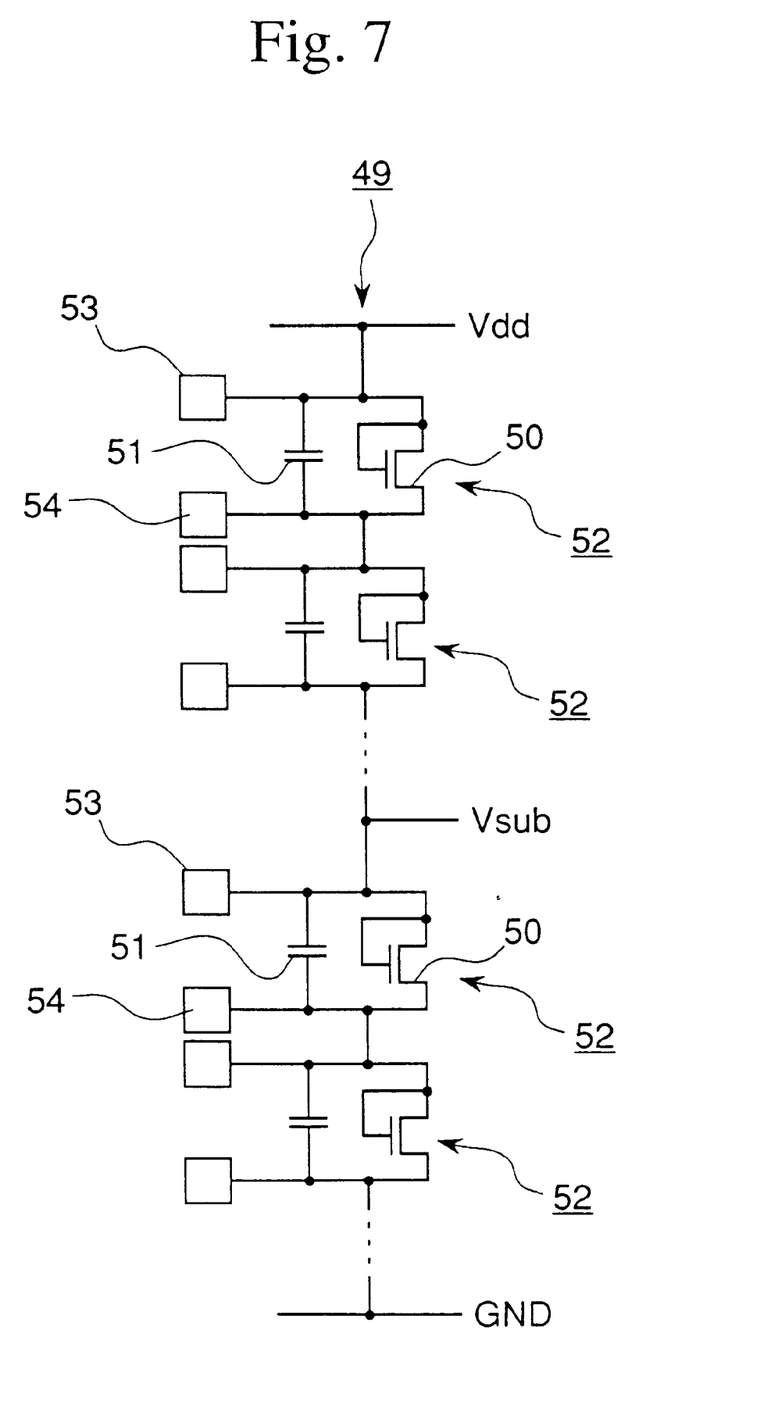
FIG. 7 is a circuit diagram showing a structure of a substrate voltage control circuit of a COD-type solid imaging circuit according to the third embodiment of the present invention.

FIG. 6 is a circuit diagram showing the structure of the substrate voltage generating circuit, and FIG. 7 is a cross-sectional diagram of the resistor which is one of the structural elements of the substrate voltage generating circuit.

Figure 5:
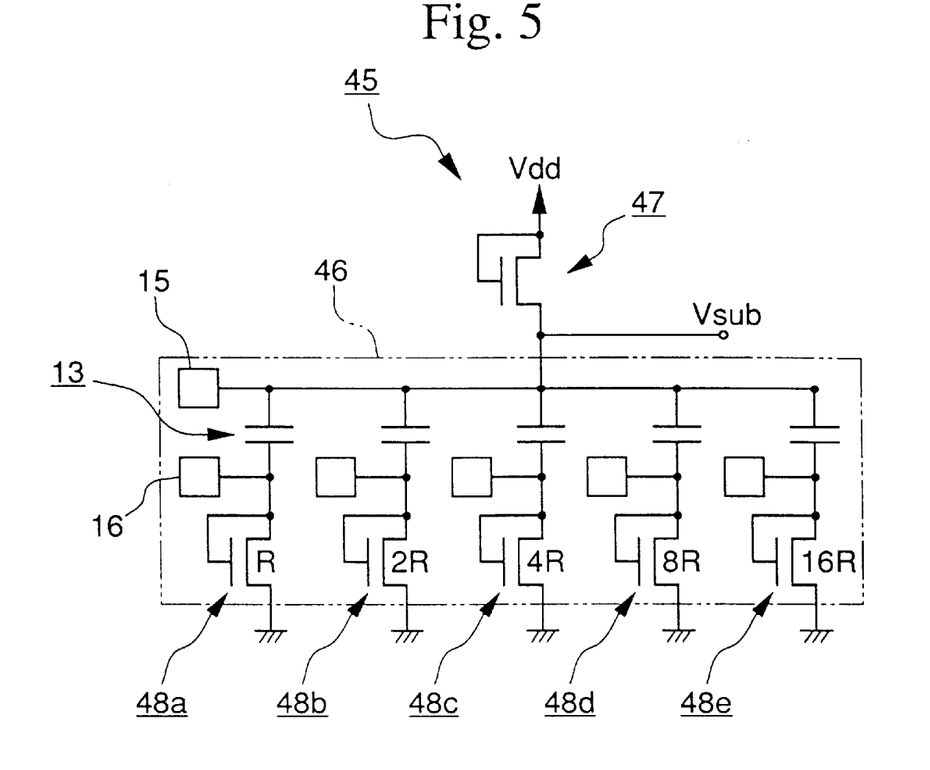
FIG. 5 is a circuit diagram showing a structure of a substrate voltage control circuit of a CCD-type solid imaging circuit according to the second embodiment of the present invention.

The substrate voltage generating circuit 45 of the present embodiment is formed, as shown in FIG. 5, such that the variable resistor 46 and the load reistors 47 are connected in series between the source potential $V_{dd}$ (the first potential) and the earth potential (the second potential), and the substrate voltage is derived from the contact of the variable resistor 46 and the load resistor 47. Furthermore, the variable resistor 46 is constituted by arranging in parallel a plurality of sets (5 sets in the present embodiment) formed by the selection switch 13 and the resistor 48a to 48e in series. In the present embodiment, the source follower-type MOSFETs are used as each resistor 48a to 48e and load resistor 47 constituting the variable resistor 13. Respective one sides of two electrodes of the anti-fuse elements forming selection switches 13 are connected in common, and pads 15 and 16 are formed for applying a voltage between one and another electrodes of the anti-fuse element. It is noted that the structure of the anti-fuse element of the second embodiment is the same as that of the first embodiment.

The resistances of respective resistors 48a to 48e constituting the variable resistor 46 are each set by $2^n$ (n=0, 1, 2, ...) times larger than the minimum resistance. That is, when the minimum resistance among resistors 48a to 48e is R, resistances of the other resistors are set 2R, 4R, 8R, and 16R. Such a setting of resistance can be easily obtained by suitably changing the gate length or the gate width of each source follower MOSFET.

Since the structure of the cell portion, the peripheral circuit wiring portion, and the anti-fuse element forming portion are the same as those of the first embodiment shown in FIGS. 2A, 2B, and 2C, and 3A, 3B, and 3C, explanations of those portions are omitted.

The source follower-type MOSFETs which constitute respective resistors 48a to 48e of the variable resistors 46 and the load resistors 47, are formed, as shown in FIG. 6, by forming a P-type well 21 on the silicon substrate 20, and by forming a N-type source region 37 and a drain region 38 on the P-type region 21. A gate insulating film 24 is formed on the substrate 20 and a gate electrode 39 made of polysilicon is formed on the gate insulating film 24. Further, the first interlayer insulating film 26 is formed over the entire surface and a gate-source short-circuit wiring 42 made of tungsten is formed for short circuiting the gate electrode 39 and the source region 37 through contact holes 40 and 41 formed in the first interlayer insulating film. Furthermore, the second interlayer insulating film 28 and the third interlayer insulating film 29 covering the gate/source short circuit wiring 42 is opened on the gate-source short-circuit wiring 42, and an upper wiring 44 made of aluminum is formed, which is connected to the gate-source short-circuit wiring 42 through that contact hole 43. The polysilicon film forming the gate electrode 39 is identical with the polysilicon film forming the charge transfer electrode 25. The tungsten film of the gate-source short-circuit wiring 42 is identical with that of the light shielding film 27 of the vertical charge transfer portion 6, and also identical with those of the lower wiring layer 32 and the lower conductive film 35 of the anti-fuse element. The aluminum film forming the upper wiring 44 is identical with those of the upper wiring layer 36 of the peripheral circuit wiring and the upper conductive film 36.

The same effect is obtained by the second embodiment as those of the first embodiment in that both embodiments provide a superior solid imaging device having a superior display quality and high reliability. Furthermore, the solid imaging device of the present embodiment comprising a variable resistor composed of five sets of selection switches 13 constituted by the anti-fuse elements and the resistors constituted by the source follower-type MOSFETs and the resistances of these resistors are set as R, 2R, 4R, 8R, and 16R. Thereby, it becomes possible to execute the detailed resistive division by combining the states in which selection switches are turned on, and to output the substrate voltage suitably controlled within a predetermined range (generally 5 to 15 V).

Furthermore, since the variable resistor 11 is so-called piano switch-type form, in which a plurality of switches and resistors are arranged in parallel, it is possible to reduce the area size required for the substrate voltage generating circuit 10. In addition, since each resistor 14a to 14e is formed by the source follower-type MOSFET, it is possible to control the resistances of respective resistors 14a to 14e by changing designs of the gate length or the gate width of respective resistors.

[Third Embodiment]

Hereinafter, the third embodiment according to the present invention is described with reference to FIG. 7.

In the first and second embodiment, although the resistance division circuit is composed by the load resistor and the variable resistor arranged in the piano switch form, the resistance division circuit is composed in the form of the third embodiment instead of the above structure. Since structures of the resistors themselves and the selection switches composed of the anti-fuse elements are the same as those of the first and second embodiments, their explanations are omitted.

The substrate voltage generating circuit 49 according to the third embodiment comprises, as shown in FIG. 7, a plurality of resistors 52 connected in series between the source voltage $V_{dd}$ (the first potential) and the earth potential GND (the second potential), wherein each resistor 52 is formed by connecting a resistor 50 made by a source follower-type MOSFETs and selection switches 51 made by anti-fuse elements in parallel and the substrate voltage $V_{sub}$ can be derived from an optional contact between those resistors 52. Pads 53 and 55 are formed in order to apply a voltage between one electrode and another electrode of the anti-fuse element forming the selection switch 51.

[Fourth Embodiment]

The fourth embodiment of the present invention is described with reference to FIG. 8. Like the third embodiment, the fourth embodiment shows another structure of the substrate voltage generating device.

Figure 8:
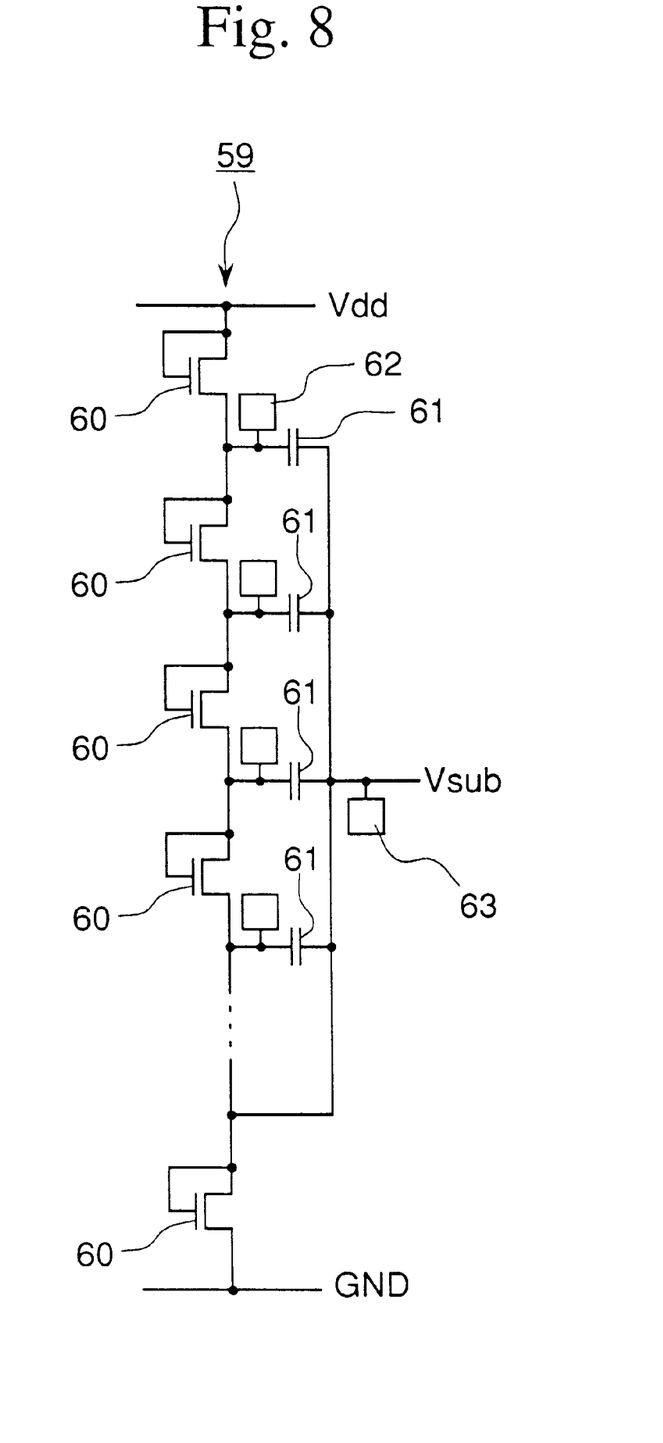
FIG. 8 is a circuit diagram showing a structure of a substrate voltage control circuit of a CCD-type solid imaging circuit according to the third embodiment of the present invention.

The substrate voltage generating device 59 according to the fourth embodiment comprises, as shown in FIG. 8, a plurality of resistors 60 made by the source follower-type MOSFETs connected in series between the source voltage $V_{dd}$ (the first potential) and the earth potential GND (the second potential), and selection switches 61 made by respective anti-fuse elements connected in between two adjacent resistors 60; and the desired substrate voltage $V_{sub}$ is obtained through the selection switches 61. Electrodes on one side of the anti-fuse elements forming the selection switch 61 are connected in common, and pads 62 and 63 are formed in order to apply a voltage between one electrode and another electrode.

As described above in detail, the present invention provides a substrate voltage generating device which is almost free from danger of generating dust due to the breakdown of an insulating film when compared to the conventional device using the fuse-type element, since switches constituting the substrate voltage generating device of the present invention are composed of anti-fuse elements, and since it is possible to convert the wiring on both sides of the insulating film into the conduction state when the insulating film is broken down. Furthermore, it is possible to improve the reliability of the device, because the present substrate voltage generating device is less sensitive to the characteristic change by light than the conventional device using a non-volatile memory. As a result, a substrate voltage generating device is obtained which is capable of preventing the generation of dust and thus the black defects during the control operation of the substrate voltage, and which is superior in display quality and high reliability.

What is claimed is:

1. A solid imaging device comprising:
   a plurality of photoelectric conversion elements;
   a charge transfer portion comprising a charge transfer electrode, which reads and transfers charge signals generated at said plurality of photoelectric conversion elements; and a substrate voltage generating circuit, which comprises a plurality of resistors connected in between a first potential and a second potential, and a plurality of selection switches for selecting said plurality of resistors, for obtaining a desired substrate voltage by combining conduction and nonconduction states of said selection switches;

wherein, said selection switches are constituted by anti-fuse elements.

2. A solid imaging device according to claim 1, wherein all of said plurality of resistors of said substrate voltage generating device are connected in parallel.

3. A solid imaging device according to claim 2, wherein said selection switches each connected in series with respect to said plurality of resistors, respectively.

4. A solid imaging device according to claim 2, wherein said selection switches are connected to respective contacts of said plurality of resistors.

5. A solid imaging device according to claim 1, wherein said substrate voltage generating circuit comprises:

a variable resistor constituted by arranging in parallel a plurality of sets composed by connecting selection switches and resistors in series; and a load resistor connected with said variable resistor in series between the first potential and the second potential.

6. A solid imaging device according to claim 5, wherein respective resistances of a plurality of resistors forming said variable resistor is set so as to be $2^n$ (n=0, 1, 2, . . . ) times the minimum resistance.

7. A solid imaging device according to claim 1, wherein said anti-fuse element is composed of a lower conductive film, upper conductive film, and an insulating film inserted between those lower and upper films, and said lower conductive film and said upper conductive film are formed by two layers selected from the group consisting of the layer constituting said charge transfer electrode, the layer constituting a light shielding film covering said charge transfer electrode, and the layer constituting the peripheral circuit wiring.

8. A solid imaging device according to claim 1, wherein each of said resistors is constituted by a MOSFET.

9. A solid imaging device according to claim 8, wherein the gate electrode of said MOSFET is formed by the same layer as said charge transfer electrode.

10. A method of manufacturing a solid imaging device claimed in claim 7, wherein the method comprises the steps of:

forming a charge transfer electrode on a substrate provided with a plurality of photoelectric conversion regions;

forming a light shielding film for covering said charge transfer electrode through a first interlayer insulating film and forming the lower conductive film of the anti-fuse element made by the same layer as said light shielding film; and forming a peripheral circuit wiring and forming the upper conductive film made by the same layer as said peripheral circuit wiring on the lower conductive layer of the anti-fuse element through a second interlayer insulating film.

11. A method of manufacturing a solid imaging device claimed in claim 7, wherein the method comprising the steps of:

forming a charge transfer electrode on a semiconductor substrate provided with a plurality of photoelectric conversion elements as well as forming the lower conductive film of the anti-fuse element made by the same layer as said charge transfer electrode;

forming a light shielding film for covering said charge transfer electrode through a first interlayer insulating film as well as forming the lower conductive film of the anti-fuse element made by the same layer as said light shielding film; and forming the peripheral circuit wiring on the second interlayer insulating film.

12. A method of manufacturing a solid imaging device claimed in claim 7, wherein the method comprising the steps of:

forming a charge transfer electrode on a substrate provided with a plurality of photoelectric conversion regions as well as forming the lower conductive film of the anti-fuse element made by the same layer as said charge transfer electrode;

forming a light shielding film covering said charge transfer electrode through a first interlayer insulating film as well as forming the lower conductive film of the anti-fuse element made by the same layer as said light shielding film; and forming a peripheral circuit wiring and forming the upper conductive film made by the same layer as said peripheral circuit wiring on the lower conductive layer of the anti-fuse element through a second interlayer insulating film.

* * * * *